Aug. 28, 1962 A. J. AVILA 3,051,826

METHOD OF AND MEANS FOR ULTRASONIC ENERGY BONDING

Filed Feb. 25, 1960

INVENTOR
A. J. AVILA
BY
Albert R. Hodges
ATTORNEY

United States Patent Office 3,051,826
Patented Aug. 28, 1962

3,051,826

METHOD OF AND MEANS FOR ULTRASONIC ENERGY BONDING

Arthur J. Avila, Flemington, N.J., assignor to Western Electric Company, Incorporated, New York, N.Y., a corporation of New York Filed Feb. 25, 1960, Ser. No. 10,952
8 Claims. (Cl. 219—128)

This invention relates to a method and means for bonding semiconductive materials to metals by the application of ultrasonic energy to such materials when the temperature of the surfaces to be bonded is at least equal to the eutectic temperature for the specific materials being bonded, but lower than the melting temperatures of such materials. More particularly, the invention relates to a method and means for bonding silicon wafers to gold-plated headers in the fabrication of semiconductive devices such as, for example, transistors.

Semiconductive devices are finding extensive usefulness in many types of electrical circuits. Much effort is being directed toward making these devices more rugged and toward increasing the upper limit of the microwave frequency range in which they can be feasibly employed. The latter objective normally involves the problem of fabricating devices of very small physical size. In the past, the fabrication of such small devices has presented an outstanding mechanical difficulty in securing strong, small area, accurately positioned uniform bonds.

Prior conventional methods of bonding semiconductive materials to metals necessarily comprised the step of thoroughly cleaning the surfaces to be bonded, as, for example, by mechanically scrubbing the surfaces with a vibrating or rotating wire brush. Since oxidation of such surfaces to be bonded is deleterious to the quality of the bond achieved, the cleaning and bonding operations were necessarily performed in non-oxidizing atmospheres.

Although such prior methods of bonding have provided generally satisfactory semiconductive devices, it is desirable not only to improve the quality of the bonds of such devices of minute size, but also to eliminate the separate step of mechanical scrubbing, consequently decreasing the unit cost of manufacture.

It is the principal object of this invention, therefore, to provide a method and means for strongly bonding semiconductive material to metals.

More particularly, an object of the invention is to provide a method and means for effecting accurately positioned, small area, uniform bonds between semiconductive transistor wafers of small cross-sectional area and metal-plated transistor headers, without any measurable impairment of the electrical or mechanical properties of these materials and without the prior necessity for extremely clean bonding surfaces.

In accordance with the present invention, these objects are accomplished by bringing the semiconductive materials and the metals into contact under pressure, preferably in an inert atmosphere, and at a temperature at least equal to the eutectic temperature of these materials. Under these conditions, energy is applied to these materials in the form of ultrasonic vibrations so as to effectuate a sufficient scrubbing action between them to effectively scrub away oxides and any foreign matter that may have been on the contact surfaces previously and which normally would be detrimental to high-quality bonding.

In accordance with a specific aspect of the invention, a silicon transistor wafer is brought into contact with a gold-plated header in an inert atmosphere under a pressure of at least 2000 pounds per square inch. The temperature of the contiguous surfaces of the wafer and header is raised to at least the eutectic temperature, 370° C., but lower than the melting points of these matrials. While the temperature of these surfaces is at or above the eutectic temperature, the header is driven by ultrasonic vibrations in the range of 18,000 to 60,000 cycles per second so as to provide a relative motion between the wafer and the header which effectuates a scrubbing action therebetween. This scrubbing action causes much of the deleterious foreign matter and oxides that may be on the surfaces being bonded to be moved out of the bond area while the eutectic bond is being formed, thus insuring high-quality uniform bonds.

Further, in accordance with another aspect of the invention, a structural arrangement for providing such bonding comprises an enclosure within which the bonding is accomplished in an inert atmosphere. Within the enclosure there is provided a pair of electrodes for engaging the sides of a header which is positioned upon a platform attached to and extending from the base of the enclosure. During the bonding operation a wafer is placed upon the header so positioned. A retractable rod extends through an aperture in the enclosure and is disposed in spaced relation to the platform. When this rod is moved toward the platform, the rod and platform will apply a compressive force to the header and the wafer positioned therebetween. The electrodes are connected to an electrical power supply so as to cause a current to pass between the electrodes and through the header, which preferably comprises a thin gold plating over a highly resistant material, such as, for example, Kovar that acts as a heat source upon the passage of current therethrough, thus providing the required bonding temperature. One of the electrodes is also coupled to a source of ultrasonic energy, so that the header is ultrasonically vibrated while heat is applied and the bond is effectuated.

The invention may be more readily understood by reference to the following detailed description and drawing of a preferred embodiment thereof, and to the appended claims.

Figure 1:
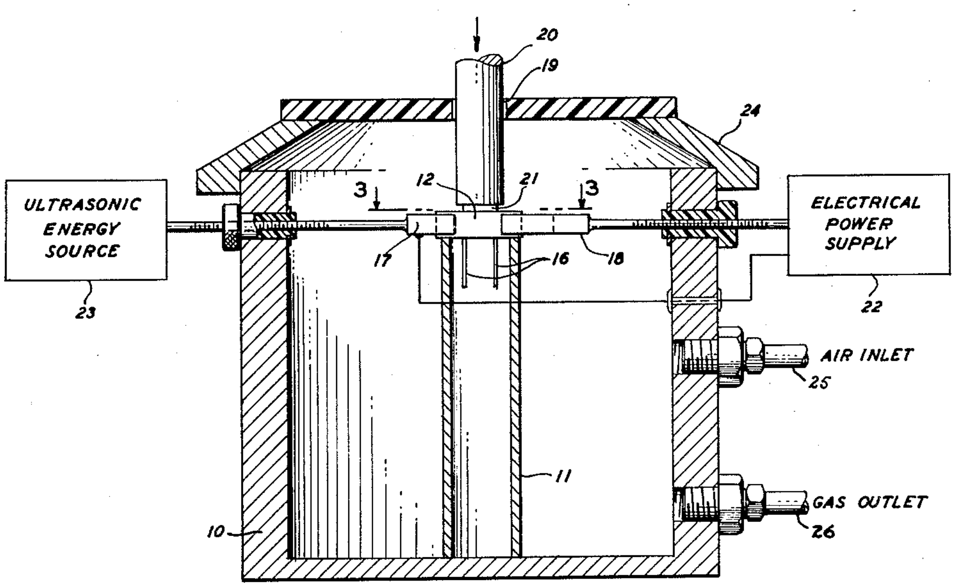
FIG. 1 illustrates the elements of structural arrangement for practicing the principles of the invention.

Referring to the drawing, FIG. 1 illustrates a structural arrangement for performing the instant bonding method. The enclosure 10 is of a type within which an inert atmosphere may be provided. Attached to the base of enclosure 10 is an extended apertured platform 11 for supporting a transistor header 12 and for receiving within its aperture header leads 16. A pair of adjustable electrodes 17 and 18 attached to the sides of enclosure 10 are aligned with respect to each other so as to engage the sides of header 12 when the electrodes are moved towards each other. Directly above the platform 11 and extending through an aperture 19 in a removable cover 24 of enclosure 10 is a retractable rod 20. Cover 24 preferably comprises a transparent material so as to enable an operator to observe the components within the enclosure 10. When rod 20 is moved toward the platform 11, it will engage a wafer 21 positioned upon header. To electrodes 17 and 18 there is connected an electrical power supply 22 which causes a current to pass between the electrodes and through header 12. Since electrode 17 is also attached to a source 23 of ultrasonic energy, it causes header 12 to ultrasonically vibrate and thus effectuates a relative motion between the wafer and header to provide a scrubbing action therebetween.

Figure 2:
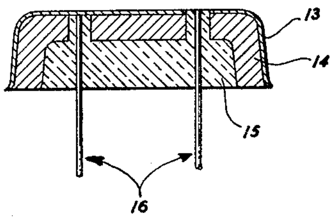
FIG. 2 is a cross-sectional view of a gold-plated header having a Kovar layer for internal heating of the header.

FIG. 2 illustrates a transistor header of the type that may be bonded to a semiconductive wafer in the structural arrangement illustrated in FIG. 1. Header 12 comprises a thin gold layer 13, an interior layer 14 of highly resistant material, such as, for example, Kovar, an alloy comprising nickel, cobalt, manganese and iron, which acts as a heat source upon the passage of current therethrough, and a glass-filled section 15 through which header leads 16 extend.

Figure 3:
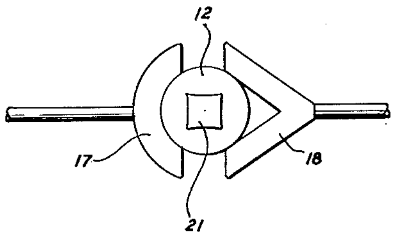
FIG. 3 is a top plane view, taken on the line A—A' of FIG. 1, of the header clamped between the electrodes and upon which is positioned a wafer.

FIG. 3 illustrates the manner in which electrodes 17 and 18 preferably engage the sides of header 12 and the manner in which a silicon wafer 21 may be positioned upon header 12. The surfaces of electrodes 17 and 18 that engage the gold-plated header 12 are preferably gold-plated so as to avoid hot spots along the electrode contact area.

The bonding operation of the invention may be preferably practiced in the following manner. Cover 24 of enclosure 10 is removed and gold-plated header 12 is positioned on platform 11 and the silicon wafer is placed on header 12. Cover 24 of the enclosure 10 is then replaced and appropriate use made of the air outlet 25 and the gas inlet 26 in enclosure 10 to render the atmosphere in the enclosure inert. Retractable rod 20 is then moved toward platform 11 until wafer 21 is pressed against header 12 with a pressure of at least 2000 pounds per square inch. Electrodes 17 and 18 are moved toward each other until they engage header 12. Upon such engagement, the current passing through header 12 due to electrical power supply 22 connected to electrodes 17 and 18 causes Kovar layer 14 of header 12 to dissipate heat into gold layer 13 and the contiguous surface of wafer 21 so as to raise their temperature to at least the eutectic temperature of gold and silicon, 370° C., but lower than the melting temperatures of the header and wafer. By means of electrode 17, which is directly coupled to ultrasonic energy source 23, ultrasonic vibrations in the range of 18,000 to 60,000 cycles per second are then applied to header 12.

The combination of an inert atmosphere, the bonding temperature being at least as high as the eutectic temperature, the compressive force applied to wafer 21 and header 12, and the ultrasonic energy applied to the header, causes a scrubbing action between the wafer and the header while a eutectic bond of gold and silicon is being formed between them. As a consequence of this scrubbing action, much of the oxides and foreign impurities on the surfaces are moved out of the bonding area. Accordingly, the concurrent scrubbing and bonding characteristics of the instant invention provide a high-quality, small area, uniform bond between the wafer and the header, without any measurable impairment of the electrical or mechanical properties of these elements even though the surfaces of these elements are not exceptionally clean prior to the bonding step.

It will be appreciated that the above-described method and arrangement are merely illustrations of the principles of the invention. Numerous other methods and arrangements may be devised by one skilled in the art without departing from the spirit and scope of the invention.

What is claimed is:

1. The method of bonding elements of semiconductive devices, which comprises the steps of placing an element of semiconductive material in contact with an element to be bonded thereto, at least the surface of the latter element being a metal capable of forming a eutectic with the semiconductive material, applying compressive forces to said elements to hold the elements in pressure contact with one another, raising the temperature of the contiguous surfaces of the elements to at least the eutectic temperature but lower than the melting temperature of either of said semiconductive material and said metal, and applying ultrasonic energy to at least one of said elements in a direction having a substantial component parallel to said contiguous surfaces to impart ultrasonic transverse motions to one element relative to the other so as to provide an ultrasonic scrubbing action between the compressed contiguous surfaces, the scrubbing action resulting in the removal of molten eutectic alloy carrying oxides and other deleterious impurities from the contact area between the contiguous surfaces while a eutectic bond is formed therebetween.

2. Method of bonding elements of semiconductive devices comprising the steps of placing a semiconductive element on a metal-surfaced element having an underlayer of highly resistant material, the contiguous surfaces of said elements being of materials having a eutectic temperature below either of their melting points, applying a force to said elements so as to hold said elements against each other under pressure, passing current through said metal-surfaced element to cause said underlayer to dissipate heat into the contiguous surfaces so as to raise their temperature to at least said eutectic temperature but below melting points of said element materials, and applying ultrasonic energy to at least one of said elements in a direction having a component parallel to said contiguous surfaces to impart transverse motions thereto, whereby said motions provide a scrubbing action between said contiguous surfaces which translates molten eutectic including surface impurities from the contact area between said elements while a eutectic bond is formed therebetween.

3. Method for bonding elements of semiconductive devices comprising the steps of placing a silicon wafer on a gold-plated header having an underlayer of highly resistant material whose temperature is directly affected by the passage of current therethrough, encompassing said wafer and header with an inert atmosphere, applying compressive forces to said elements so as to hold them against each other under pressure, heating said wafer and header to at least 370° C. but lower than the melting temperature of either gold or silicon, and applying ultrasonic energy in the range of 18,000–60,000 cycles per second to at least one of said elements in a direction parallel to said contiguous surfaces so as to impart transverse motions thereto, whereby said motions provide a scrubbing action between said compressed surfaces for translating a molten eutectic comprising deleterious surface impurities from the contact area between said surfaces while a eutectic bond is formed therebetween.

4. Method of bonding semiconductive devices comprising the steps of placing a silicon wafer on a gold-plated header having an underlayer of highly resistant material whose temperature is directly affected by current passing therethrough, encompassing said elements with an inert atmosphere, applying a force to said header and wafer so as to hold them against each other under a pressure of at least 2000 lbs. per square inch, passing a current through said header to cause said underlayer to dissipate heat into said wafer and header for raising the temperature of their compressed contiguous surfaces to at least 370° C. but lower than the melting temperature of either gold or silicon, and applying ultrasonic energy in the range of 18,000 to 60,000 cycles per second to said header in a direction parallel to said contiguous surfaces so as to impart minute transverse motions thereto, whereby said motions provide a scrubbing action between said compressed surfaces for translating a molten eutectic comprising deleterious surface impurities from the contact area between said surfaces while a eutectic bond is formed therebetween.

5. Apparatus for bonding elements of semiconductive devices comprising an atmosphere-controlled enclosure having access means for permitting the placing of elements to be bonded within said enclosure, a platform within said enclosure upon which said elements are to be supported, a retractable rod extending through an aperture in said enclosure and positioned directly in line with said platform for applying compressive forces to said elements, a pair of adjustable electrodes attached to said enclosure and aligned so as to engage the sides of one of said elements when said electrodes are moved toward each other, a heating means for raising the temperature of said elements above their eutectic temperature but below their melting temperatures, and a source of ultrasonic energy coupled to one of said electrodes for imparting transverse motions to the electrode engaged element to cause a scrubbing action between the contacting faces of the compressed elements.

6. Apparatus for bonding elements of semiconductive devices comprising an atmosphere-controlled enclosure having access means for permitting the placing of elements to be bonded within said enclosure, a platform within said enclosure upon which said elements are to be supported, a retractable rod extending through an aperture in said enclosure and positioned directly in line with said platform for applying compressive force to said elements, a pair of adjustable electrodes attached to said enclosure and aligned so as to engage the sides of one of said elements when said electrodes are moved toward each other, said electrodes being connected to an electrical power source that provides a current between said electrodes and through at least one of said elements for raising the temperature of said elements to at least their eutectic temperature but below their melting temperatures, and a source of ultrasonic energy coupled to one of said electrodes for imparting transverse motions to said electrode engaged element so as to provide a scrubbing action between the compressed elements.

7. Apparatus for bonding elements of semiconductive devices comprising an atmosphere-controlled enclosure having access means for permitting the placing of elements to be bonded within said enclosure, a platform attached to the interior base of said enclosure upon which said elements are to be supported, a retractable rod extending through an aperture in said enclosure and positioned directly in line with said platform for applying compressive force to said elements, a pair of adjustable electrodes attached to said enclosure and aligned so as to engage the sides of one of said elements when said electrodes are moved toward each other, said electrodes being connected to an electrical power source, and a source of ultrasonic energy in the range of 18,000 to 60,000 cycles per second coupled to one of said electrodes for imparting transverse motions to said electrode engaged element so as to provide a scrubbing action between the contiguous surfaces of said elements.

8. Apparatus for bonding elements of semiconductive devices comprising an atmosphere-controlled enclosure having access means for permitting the placing of elements to be bonded within said enclosure, an extended apertured platform attached to the interior base of said enclosure upon which said elements are to be supported, a retractable rod extending through an aperture in said enclosure and positioned directly in line with said platform for applying compressive force to said elements, a pair of adjustable electrodes attached to said enclosure and aligned so as to engage one of said elements when said electrodes are moved toward each other, said electrodes being connected to an electrical power source that provides a current between said electrodes and through at least one of said elements for raising the temperature of said elements to at least their eutectic temperature but below their melting temperatures, and a source of ultrasonic energy in the range of 18,000 to 60,000 cycles per second coupled to one of said electrodes for imparting transverse motions to said engaged electrode so as to provide a scrubbing action between said elements.

References Cited in the file of this patent

UNITED STATES PATENTS

| | | |
|---|---|---|
| 2,757,324 | Pearson | July 31, 1956 |
| 2,847,556 | Brennen | Aug. 12, 1958 |
| 2,877,283 | Justi | Mar. 10, 1959 |
| 2,939,058 | Masterson | May 31, 1960 |
| 2,946,119 | Jones | July 26, 1960 |
| 2,978,570 | Hanlein | Apr. 4, 1961 |